US 9,799,543 B2

(12) United States Patent
Fuerfanger et al.

(10) Patent No.: US 9,799,543 B2
(45) Date of Patent: Oct. 24, 2017

(54) PROCESS BOX, ARRANGEMENTS AND METHODS FOR PROCESSING COATED SUBSTRATES

(71) Applicant: SAINT-GOBAIN GLASS FRANCE, Courbevoie (FR)

(72) Inventors: Martin Fuerfanger, Steinhoering (DE); Dang Cuong Phan, Aachen (DE); Stefan Jost, Munich (DE)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 73 days.

(21) Appl. No.: 14/350,801

(22) PCT Filed: Feb. 8, 2013

(86) PCT No.: PCT/EP2013/052520
§ 371 (c)(1),
(2) Date: Apr. 9, 2014

(87) PCT Pub. No.: WO2013/120779
PCT Pub. Date: Aug. 22, 2013

(65) Prior Publication Data
US 2014/0363916 A1 Dec. 11, 2014

(30) Foreign Application Priority Data
Feb. 16, 2012 (EP) .................... 12155848

(51) Int. Cl.
H01L 21/673 (2006.01)
H01L 21/67 (2006.01)
H01L 31/18 (2006.01)

(52) U.S. Cl.
CPC .. *H01L 21/67346* (2013.01); *H01L 21/67115* (2013.01); *H01L 21/67353* (2013.01); *H01L 21/67383* (2013.01); *H01L 31/1864* (2013.01)

(58) Field of Classification Search
CPC ............... H01L 31/18; H01L 21/67115; H01L 21/67109; B23Q 3/00; C23C 16/4582
(Continued)

(56) References Cited

U.S. PATENT DOCUMENTS 5,578,503 A 11/1996 Karg et al.
5,674,786 A 10/1997 Turner et al.
(Continued)

FOREIGN PATENT DOCUMENTS

CN 1483218 A 3/2004
DE 4324318 1/1995
(Continued)

OTHER PUBLICATIONS

PCT International Search Report mailed on Jun. 25, 2013 for PCT Application PCT/EP2013/052520 filed on Feb. 8, 2013 in the name of Saint-Gobain Glass France (English Translation+German Original).
(Continued)

*Primary Examiner* — Gregory A Wilson
(74) *Attorney, Agent, or Firm* — Steinfl & Bruno LLP

(57) ABSTRACT

A transportable process box for processing substrates coated on one side is described. The box has a base for the placement of a first substrate in a manner such that the latter is supported over the full area, a frame, a cover which is placed onto the frame, and an intermediate element which is arranged between the base and the cover and is intended for the placement of a second substrate in a manner such that the latter is supported over the full area. Arrangements and methods for processing substrates are also described.

11 Claims, 3 Drawing Sheets

(58) Field of Classification Search
USPC ......... 432/253, 258, 259; 219/443.1, 444.1; 427/557
See application file for complete search history.

(56) References Cited

U.S. PATENT DOCUMENTS

| | | | | |
|---|---|---|---|---|
| 5,837,555 | A * | 11/1998 | Kaltenbrunner | G01J 5/0003 118/724 |
| 6,031,205 | A | 2/2000 | Shimazu | |
| 6,176,667 | B1 * | 1/2001 | Fairbairn | H01L 21/67017 414/217 |
| 7,022,948 | B2 | 4/2006 | Shang et al. | |
| 9,076,742 | B2 * | 7/2015 | Ota | H01L 21/67115 |
| 9,082,728 | B2 * | 7/2015 | Yokouchi | H01L 21/324 |
| 9,352,431 | B2 * | 5/2016 | Palm | C23C 16/4582 |
| 2005/0188923 | A1 * | 9/2005 | Cook | C23C 16/4584 118/728 |
| 2006/0245852 | A1 * | 11/2006 | Iwabuchi | H01L 21/67201 414/217 |
| 2010/0040437 | A1 * | 2/2010 | Iwabuchi | C23C 16/4586 414/217 |
| 2010/0196599 | A1 * | 8/2010 | Ponnekanti | H01L 21/6719 427/248.1 |
| 2010/0258932 | A1 * | 10/2010 | Yoshida | H01L 21/561 257/686 |
| 2011/0117693 | A1 * | 5/2011 | Palm | F27B 17/0025 438/97 |
| 2013/0029479 | A1 * | 1/2013 | Jost | C23C 16/4583 438/479 |
| 2013/0067723 | A1 * | 3/2013 | Palm | C23C 16/4582 29/559 |
| 2013/0224953 | A1 * | 8/2013 | Salinas | H01L 21/02063 438/689 |

FOREIGN PATENT DOCUMENTS

| | | |
|---|---|---|
| DE | 102008022784 | 11/2009 |
| EP | 0662247 | 7/1997 |
| EP | 2200097 | 6/2010 |
| EP | 2360720 | 8/2011 |
| EP | 2360721 | 8/2011 |
| JP | 06239635 A | 8/1994 |
| JP | 20133520790 A | 6/2013 |
| TW | 300327 B | 3/1997 |
| WO | 2004/032593 | 4/2004 |

OTHER PUBLICATIONS

PCT Written Opinion mailed on Jun. 25, 2013 for PCT Application PCT/EP2013/052520 filed on Feb. 8, 2013 in the name of Saint-Gobain Glass France (English Translation+German Original).

Palm et al., "CIS module pilot processing applying concurrent rapid selenization and sulfurization of large area thin film precursors," Thin Solid Films 431-432, pp. 414-522 (2003).

* cited by examiner

PROCESS BOX, ARRANGEMENTS AND METHODS FOR PROCESSING COATED SUBSTRATES

CROSS REFERENCE TO RELATED APPLICATIONS

The present application is the US national stage of International Patent Application PCT/EP2013/052520 filed on Feb. 8, 2013 which, in turn, claims priority to European Patent Application EP 12155848.0 filed on Feb. 16, 2012.

The invention relates to a process box, arrangements, and methods for processing substrates coated on one side. It refers, in particular, to the thermal treatment of substrates that are coated with precursor layers for producing absorbers for thin-film solar cells.

Photovoltaic layer systems for the direct conversion of sunlight into electrical energy are well known. They are commonly referred to as "solar cells", with the term "thin-film solar cells" referring to layer systems with small thicknesses of only a few microns that require substrates for adequate mechanical stability. Known substrates include inorganic glass, plastics (polymers), or metals, in particular, metal alloys, and can, depending on the respective layer thickness and the specific material properties, be designed as rigid plates or flexible films.

In view of the technological handling quality and efficiency, thin-film solar cells with a semiconductor layer of amorphous, micromorphous, or polycrystalline silicon, cadmium telluride (CdTe), gallium arsenide (GaAs), chalcopyrite compounds, in particular, copper-indium/gallium-disulfur/diselenide, abbreviated by the formula $Cu(In,Ga)(S,Se)_2$, or kesterite compounds, in particular, copper-zinc/tin-disulfur/diselenide, abbreviated by the formula $Cu_2(Zn,Sn)(S,Se)_4$ have proved advantageous.

Since, with individual solar cells, only voltage levels of less than 1 V are obtainable, as a rule, many solar cells are connected to each other in series in a solar module. Thus, output voltages useful for applications are obtained. Here, thin-film solar modules offer the particular advantage that the solar cells can already be connected in an integrated form during production of the layers. Thin-film solar modules connected in series have already been described many times in the patent literature. Reference is made in this regard merely by way of example to the printed publications DE 4324318 C1 and EP 2200097 A1.

The specific properties of the absorber have substantial influence on the light yield in thin-film solar modules. Until recently, the structure and composition of the absorber has been the subject of intense research activity. Of the various possibilities for producing the semiconductor layer, essentially two methods have prevailed in recent years. These are vapor co-deposition of the individual elements onto a hot substrate as well as the successive application of the elements in individual layers (precursor layers), for example, by magnetron cathode sputtering onto a cold substrate combined with subsequent rapid thermal processing (RTP), during which the actual crystal formation and phase conversion of the precursor layers into the semiconductor layer occurs. This approach is described in detail, for example, in J. Palm et al., "CIS module pilot processing applying concurrent rapid selenization and sulfurization of large area thin film precursors", Thin Solid Films 431-432, pp. 414-522 (2003).

In industrial series production, RTP thermal treatment of the precursor layers takes place in so-called "in-line systems", in which the coated substrates are transported via an intake airlock chamber and heated in heating chambers according to a precisely defined temperature cycle. The heating is typically done by electrically operated radiant heaters. Then, the processed substrates are cooled in cooling chambers and/or in a cooling line, followed by discharge from the in-line system by means of a discharge airlock chamber. Such a method is known, for example, from EP 0662247 B1.

Generally, the RTP-thermal treatment is a cost intensive process in the production of thin-film solar cells, which requires precise control of the processing atmosphere. For this purpose, it is known to limit the processing space around the substrate by a process box. This enables keeping the partial pressure of the readily volatile chalcogen components such as selenium or sulfur at least largely constant during the thermal treatment. Moreover, the exposure of the thermal treatment chamber to corrosive gases is reduced. Such a process box is known, for example, from DE 102008022784 A1.

Also, the European patent application EP 2360720 A1 presents a transportable process box for processing two substrates coated on one side, in which the two substrates either lie one atop the other with their uncoated sides together or are separated from each other by a spacer. The coatings to be processed are turned away from each other ("back-to-back"). The lower substrate is distanced from the base of the process box by a spacer, with the spacer implemented such that the downward facing coating of the lower substrate is freely accessible by process gases. A full-area placement of the lower substrate is not possible. The lower substrate is stressed by the force of the weight of the upper substrate. The coatings are processed in non-symmetrical processing spaces.

European patent application EP 2360721 A1 presents a different arrangement of the two coated substrates. Here, the coatings to be processed are turned toward each other ("face-to-face"). A common processing space for the two coatings is formed by the substrates themselves. A full-area placement of the substrates is not possible. In addition, the two coatings have no individual processing space.

The object of the present invention consists in advantageously improving process boxes known in the prior art for the thermal treatment of coated substrates. In particular, an economical, energy-saving process box should be provided, with which system throughput is increased without substantially increasing investment and operating costs. In addition, coated substrates with a particularly high quality should be producible in industrial series production.

These and other objects are accomplished according to the proposal of the invention by a transportable process box, arrangements, and methods for processing substrates coated on one side in accordance with the coordinated claims. Preferred embodiments of the invention emerge from the characteristics of the subclaims.

In the context of the invention, the term "substrate" refers to a flat body, which has two opposite surfaces, wherein, on one of the two surfaces, typically, a layer structure ("coating") containing a plurality of layers is applied. The other surface of the substrate is, as a rule, uncoated. Preferably, this is a substrate coated with precursor layers of an absorber (e.g., chalcopyrite or kesterite compound) for producing a thin-film solar module, which must be subjected to an RTP-thermal treatment.

The term "loose/loosely" refers to the circumstance that a body is placed or mounted on another body, with no fixed connection or no fastening between the bodies. The two bodies can thus be removed from each other, nondestructively, without releasing a connection or fastening means.

The process box according to the invention is implemented such that it can be assembled for loading with substrates and, in particular, disassembled again (nondestructively) for removal of the processed substrates.

It comprises a base, for example, a base plate, which is implemented such that a first substrate can be placed with full-area support, preferably with its uncoated substrate side, with the base further implemented such that the coatings of the two substrates, substantially or mainly the coating of the first substrate, can be thermally treated by the radiation energy of radiation supplied on the underside of the base.

The term "with full-area support" refers here and in the following to the circumstance that a substrate is placed with its bottom surface (uncoated side) on the base or the intermediate element mentioned below, with the bottom surface of the substrate supported completely, i.e., in every section of its area. Possible deformation of the substrate during the thermal treatment can thus be prevented.

The process box further comprises a frame for connecting the base to a cover, as well as the cover. The cover is implemented such that the coatings of the substrates, substantially or mainly the coating of the second substrate, can be thermally treated by the radiation energy of radiation supplied on the top side of the cover. The cover is preferably loosely mounted on the frame. The frame is likewise preferably loosely mounted on the base. It is, however, also conceivable for the frame to be fixedly connected to the base. By means of the mounting of the cover on the frame, a gas-tight or (without further sealing) a quasi-gas-tight processing space can be realized in a simple manner.

The process box further comprises an intermediate element arranged between the base and the cover, which is implemented such that a second substrate is placeable with full-area support. The intermediate element can, in particular, be implemented in the form of a plate-shaped element, i.e., intermediate plate.

A (reduced) processing space for processing the two substrates is formed by the base, cover, and frame. In the context of the invention, "processing space" is understood to mean an open, quasi-enclosed or quasi-gas-tight, or gas-tight processing space. An open processing space permits free gas exchange between the processing space and the external surroundings of the process box. In contrast to this, with a gas-tight processing space, such a gas exchange between the processing space and the external surroundings is completely prevented. With a quasi-enclosed or quasi-gas-tight processing space, the process box is gas-tight up to a certain maximum pressure difference between the processing space and the external surroundings. When the maximum pressure difference is exceeded, a pressure equalization occurs between the processing space and the external surroundings. The maximum pressure difference depends on the specific design of the process box.

The process box can have gas connections in order to selectively provide the processing space with a specific gas atmosphere during specific process steps. The gas atmosphere can, for example, contain reactive gases such as $H_2S$, $H_2Se$, S-vapor, Se-vapor, or $H_2$ as well as inert gases such as $N_2$, He, or Ar. It is understood that, even in the case of a gas-tight or quasi-gas-tight processing space, the process box can have gas connections by means of which process gases or inert gases can be introduced into the processing space with external overpressure.

In the process box according to the invention, the base, intermediate element, cover, and frame can, in principle, be made of any material suitable for the intended use. The base, intermediate element, cover, and frame preferably contain or are made of metal, glass, ceramic, glass ceramic, carbon-fiber-reinforced carbon materials, or graphite. The base should be implemented to enable thermal treatment by thermal energy supplied on the underside of the base. The same is true for the cover, which is implemented to enable thermal treatment by thermal energy supplied on the top side of the cover. The base and cover can, for this purpose, be transparent, partially transparent, or opaque to electromagnetic radiation for supplying thermal energy for processing the substrates. The base and cover can, in particular, also contain a material (e.g., graphite) or be made of such a material, which is suitable to at least partially, in particular completely, absorb the electromagnetic radiation from radiation sources for supplying thermal energy for processing the substrates in order to be heated itself. The heated base or cover can then serve as a secondary heat source for the heating, especially of the respective adjacent substrate, which can, in particular, result in a homogenization of heat distribution.

The process box according to the invention advantageously enables simultaneous processing (thermal treatment) of two substrates coated on one side. By means of the full-area supporting of the two substrates, the risk of substrate deformation due to gravity during thermal treatment, which is commonly done above the glass softening point, can be avoided. In contrast to this, in prior art process boxes (e.g., EP 2360720 A1 and EP 2360721 A1), additional support elements had to be provided to avoid or reduce substrate deformation. There is also the fact that—depending on the respective configuration—at least with one of the two substrates, contact of the coating to be processed by the support element cannot be avoided. In the process box according to the invention, the substrates can be processed without contacting of the coating of the respective substrate being necessary. Damaging of the coating and/or substrate can thus be avoided. In addition, the automated handling of the substrate is facilitated since the two substrates can be placed in each case on the base or the intermediate element with their coating facing upward and thus do not have to be rotated. In the prior art process boxes, with a "face-to-face" configuration or "back-to-back" configuration one of the two substrates had to be rotated, which is associated with increased production costs and the risk of increasing defective goods.

Another substantial advantage results from the fact that the process box can be simply and economically assembled and loaded using automation outside a process chamber (e.g., thermal treatment chamber). The same is true for the disassembly of the process box and the removal of the processed substrate. Thus, the cycle time for continuous processing of substrates in series production is clearly reducible.

In the case of a gas-tight or quasi-gas-tight processing space, the substrates loaded into the process box are protected against environmental influences even outside the process chamber. In an in-line system, the loaded process box can be transported between different process chambers without having to remove the substrates coated on one side from the processing space.

The process box can optionally be loaded with one or two substrates, with loading with two substrates preferred for increasing throughput. The loading of the process box can be done particularly simply by placing the substrates on the base and the intermediate element, such that simple and economical automation is enabled in industrial series production.

In an advantageous embodiment of the process box according to the invention, the intermediate element is loosely place on a step formed by the frame, which enables a particularly simple and fast assembly as well as loading of the process box with substrates coated on one side in industrial series production. In addition, the processing space of the process box is divided in a particularly simple manner only (exclusively) by the intermediate element into two processing subspaces, namely, a first processing subspace for processing the first substrate and a second processing subspace for processing the second substrate. The two processing subspaces can be fluidically connected to each other. Alternatively, however, it is also possible for the two processing subspaces to be gas-tightly or quasi-gas-tightly separated from each other. By means of this measure, each substrate can have its own specifically adapted processing subspace. Thus, the two coatings of the substrates can, for example, be processed differently. Preferably, the processing subspaces are implemented symmetrically, resulting from an identical height or (vertical) dimension of the processing subspaces such that the substrates are uniformly processable. This supports the achievement of high quality requirements.

In an alternative embodiment to this, the process box is loosely mounted on a first spacer supported on the base and/or on a second spacer supported on the first substrate, with the intermediate element implemented such that it, together with the first spacer or second spacer, divides the processing space into a first ersten processing subspace for processing the first substrate and a second processing subspace for processing the second substrate. The spacers are in each case different from the frame. By means of the spacers, a particularly simple and fast assembly as well as loading of the process box with substrates coated on one side is enabled in industrial series production. Preferably, the second spacer is supported in an edge zone of the first substrate that is coating-free or is at least not provided as a functional surface. In the case of thin-film solar modules, such an edge zone is regularly provided so that, advantageously, a loss of optically active area can be avoided.

The invention also extends to a method for processing substrates coated on one side in a transportable process box according to the invention, as has been described above, with the following steps:

In a first step, the process box is installed and loaded with one or a plurality of substrates. For this purpose, a base is prepared, by means of which a first substrate can be supported over its full area and which is implemented such that the coatings of the substrates, substantially or mainly a coating of a first substrate applied thereon, can be thermally treated by radiation energy supplied on the underside of the base. A frame for connecting the base to a cover is loosely mounted on the base. Optionally, a first substrate (with its uncoated side downward) is placed on the base. In addition, an intermediate element is arranged, by means of which a second substrate can be supported over its full area. Optionally, a second substrate (with its uncoated side downward) is placed on the intermediate element. Then, the cover is loosely mounted on the frame to form the process box, with the cover implemented such that the coatings of the substrates, substantially or mainly a coating of the second substrate, are thermally treatable by radiation energy supplied on the top side of the cover. A processing space for processing the two substrates is formed by the base, cover, and frame. The process box can be loaded with one or two substrates.

In a second step, the process box is transported into a thermal treatment chamber with radiant heaters.

In a third step, thermal energy or radiation energy is supplied on the underside of the base for the thermal treatment of the coatings of the substrates, substantially or mainly the coating of the first substrate, and/or thermal energy or radiation energy is supplied on the top side of the cover element for the thermal treatment of the coatings of the substrates, substantially or mainly the coating of the second substrate.

By means of the method according to the invention, a process box can be assembled and loaded using automation in a simple manner outside the process chamber. One or two substrates coated on one side can be processed (thermally treated) particularly simply and economically with high production quality.

In an advantageous embodiment of the method according to the invention, the intermediate element is loosely mounted on a step formed by the frame, which enables particularly simple assembly and loading of the process box. Alternatively, the intermediate element is loosely mounted on a first spacer supported on the base and/or on a second spacer supported on the first substrate, which likewise enables particularly simple assembly and loading of the process box.

Also presented is a transportable process carrier for forming a process box for processing substrates coated on one side. Here and in the following, the term "process carrier" refers to a pre-installable open assembly for forming the process box. The process carrier comprises a base, which is implemented such that a first substrate is placeable with full-area support and the coatings of the substrates, substantially or mainly the coating of the first substrate, are thermally treatable by radiation energy supplied on the underside of the base. The process carrier further comprises a frame for connecting the base to a cover, with the frame implemented such that the cover is loosely mountable. The frame can be loosely mounted on the base. Alternatively, the frame is fixedly connected to the base. The process carrier further comprises an intermediate element, which is implemented such that a second substrate is placeable with full-area support, with the intermediate element loosely mounted on a step formed by the frame.

The process carrier can be assembled and loaded with substrates outside a process chamber and (nondestructively) disassembled for removal of the processed substrates. By means of a cover stationarily arranged in a process chamber for processing the coated substrates, the process carrier can be completed to form the process box. By this means, costs can be saved in series production since the cover is reusable and no separate covers need be provided for the process boxes.

The invention further extends to an arrangement for processing substrates coated on one side in a process box, which comprises a process carrier implemented as described above. Moreover, the arrangement comprises a cover arranged stationarily in a process chamber for loose mounting on the frame of the process carrier to form the process box, which is implemented such that the coatings of the substrates, substantially or mainly the coating of the second substrate, are thermally treatable by radiation energy supplied on the top side of the cover, as well as a movement mechanism for the relative movement of the cover and the process carrier. The movement mechanism is implemented such that the cover is movable relative to the process carrier and/or the process carrier is movable relative to the cover, in order to mount the cover on the frame. A processing space for processing the two substrates is formed by the base, frame, and cover.

The invention further extends to a method for processing substrates coated on one side in a process box in an arrangement implemented as described above.

In a first step, the process carrier implemented as described above is assembled and loaded with one or a plurality of substrates. For this purpose, in a first alternative, a base is prepared, by means of which a first substrate can be supported over its full area and which is implemented such that the coatings of the substrates, substantially or mainly a coating of a first substrate applied thereon, can be thermally treated by radiation energy supplied on the underside of the base. A frame for connecting the base to a cover is loosely mounted on the base. In a second alternative, a base which is fixedly connected to the frame is prepared. Optionally, the first substrate (with its uncoated side downward) is placed on the base. In addition, an intermediate element, by means of which a second substrate can be supported over its full area, is loosely installed, in a first alternative, on a step formed by the frame or, in a second alternative, on a first spacer supported on the base and/or on a second spacer supported on the first substrate. Optionally, the second substrate (with its uncoated side downward) is placed on the intermediate element.

In a second step, the loaded process carrier is transported into a thermal treatment chamber with radiant heaters.

In a third step, a cover stationarily arranged in the thermal treatment chamber is loosely mounted on the frame to form the process box, with the cover implemented such that the coatings of the substrates, substantially or mainly a coating of the second substrate, is thermally treatable by radiation energy supplied on the top side of the cover. A processing space for processing the two substrates is formed by the base, frame, and cover.

In a fourth step, thermal energy or radiation energy is supplied on the underside of the base for the thermal treatment of the coatings of the substrates, substantially or mainly the coating of the first substrate, and/or thermal energy or radiation energy is supplied on the top side of the cover for the thermal treatment of the coatings of the substrates, substantially or mainly the coating of the second substrate.

By means of the method according to the invention, an open process carrier can be assembled and loaded using automation in a simple manner outside the process chamber. One or two substrates coated on one side can be processed (thermally treated) particularly simply and economically with high production quality.

Further presented is a transportable open process carrier for forming a process box for processing substrates coated on one side, with a base, which is implemented such that a first substrate is placeable with full-area support and coatings of the substrates are thermally treatable by radiation supplied on the underside of the base, an intermediate element, which is implemented such that a second substrate is placeable with full-area support, wherein the intermediate element is loosely mounted on a first spacer supported on the base and/or on a second spacer supported on the first substrate.

Such a process carrier can be assembled for loading with substrates outside a process chamber and disassembled (nondestructively) for removal of the processed substrates. By means of the cover arranged stationarily in a process chamber with the frame connected thereto, the process carrier can be completed to form the process box. By this means, costs can be saved in series production.

The invention further extends to an arrangement for processing substrates coated on one side in a process box, which comprises a process carrier as described immediately above. The arrangement further comprises a cover stationarily arranged in a process chamber, with a frame fastened thereon for mounting on the base to form the process box, wherein the cover is implemented such that the coatings of the substrates, substantially or mainly the coating of the second substrate, is thermally treatable by radiation energy supplied on the top side of the cover. The arrangement further comprises a movement mechanism for moving the cover with the frame and/or processing carrier, which is implemented such that the frame is mountable on the base. A processing space for processing the two substrates is formed by the base, cover, and frame.

The invention further extends to a method for processing substrates coated on one side in an arrangement implemented as described immediately above.

In a first step, such a process carrier is assembled and loaded with one or a plurality of substrates. For this purpose, a base is prepared by means of which the first substrate can be supported over its full area and which is implemented such that the coatings of the substrates, substantially or mainly a coating of a first substrate applied thereon, can be thermally treated by radiation energy supplied on the underside of the base. Optionally, a first substrate (with its uncoated side downward) is placed on the base. In addition, an intermediate element, by means of which a second substrate can be supported over its full area, is loosely mounted on a first spacer supported on the base and/or on a second spacer supported on the first substrate. Optionally, a second substrate (with its uncoated side downward) is placed on the intermediate element.

In a second step, the loaded process carrier is transported into a thermal treatment chamber with radiant heaters.

In a third step, a frame fixedly connected to a cover and stationarily arranged in the thermal treatment chamber is loosely mounted on the base to form the process box, with the cover implemented implemented such that the coatings of the substrates, substantially or mainly a coating of the second substrate, are thermally treatable by radiation energy supplied on top side of the cover. A (reduced) processing space for processing the two substances is formed by the base, frame, and cover.

In a fourth step, thermal energy is supplied on the underside of the base for the thermal treatment of the coatings of the substrates, substantially or mainly the coating of the first substrate, and/or thermal energy is supplied on the top side of the cover for the thermal treatment of the coatings of the substrates, substantially or mainly the coating of the des second substrate.

By means of the method method according to the invention, an open process carrier can be assembled and loaded in a simple manner using automation outside the process chamber. Two substrates coated on one side can be processed (thermally treated) particularly simply and economically with high production quality. By the provision of a stationary cover and stationary frame, production costs can be saved. Since the cover and the frame are fixedly connected to each other, the process carrier can be completed to form the process box in a simple manner.

It is understood that the various embodiments of the invention can be realized individually or in any combinations. In particular, the characteristics mentioned above and to be explained in the following can be used not only in the combinations indicated, but also in other combinations or alone, without departing from the scope of the present invention.

BRIEF DESCRIPTION OF THE DRAWINGS

The invention is now explained in detail using exemplary embodiments with reference to the accompanying figures. They depict in simplified, not to scale representation.

The figures depict a process box 1 oriented horizontally in a typical working position with the understanding that the process box 1 can also be otherwise oriented. The position and direction indications reported in the following description are based on the depiction of the process box 1 in the figures and serve only for a simpler description of the invention with the invention not to be restricted thereby.

Figure 1:
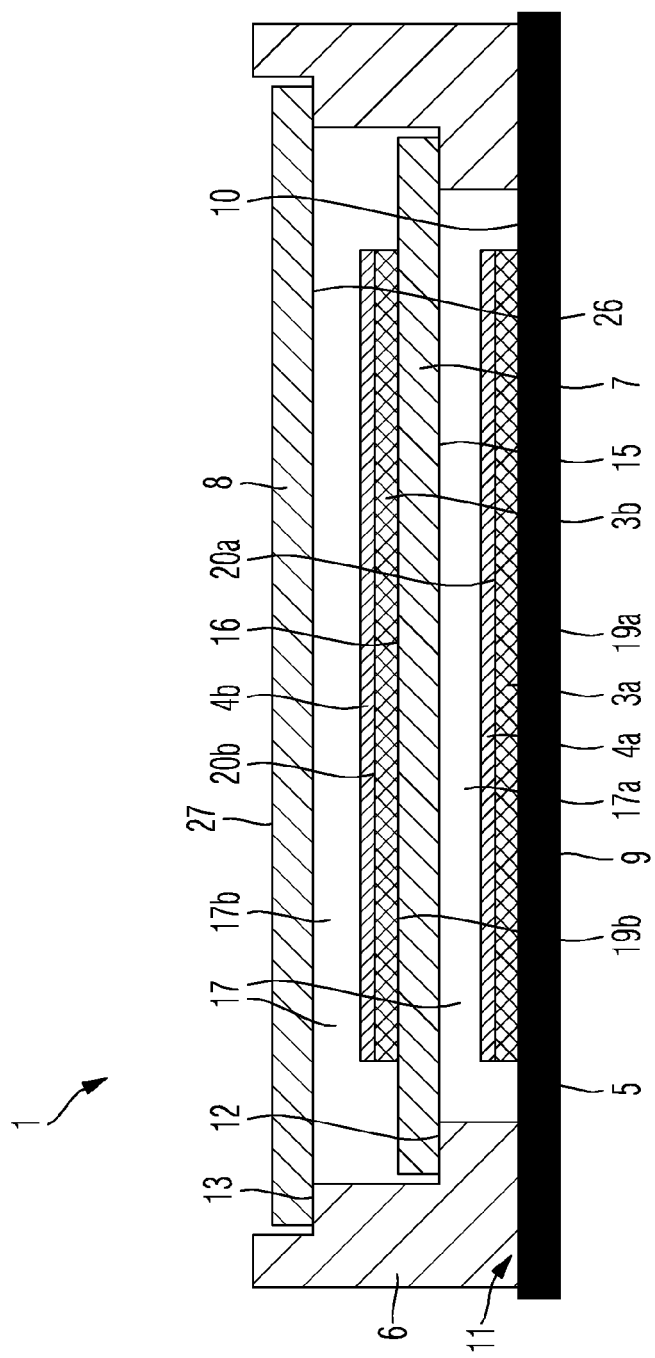
FIG. 1 using a cross-sectional view, an exemplary embodiment of the process box for processing substrates coated on one side according to the invention.

Reference is made first to FIG. 1, in which an exemplary embodiment of the process box 1 is illustrated using a vertical section. The process box 1 serves for processing substrates coated on one side 3a, 3b, for example, for producing thin-film solar modules. Although two substrates 3a, 3b are depicted, it is understood that the process box 1 can likewise be used for processing only a single substrate.

According to the figure, the process box 1 comprises a flat base 5, which is implemented here, for example, as a plate or rectangular solid body with a bottom base surface 9 and a top base surface 10. In an edge region 11 of the base 5, a closed frame 6 is loosely mounted on the top surface of the base 10. However, it would also be conceivable for the frame 6 to be fixedly connected to the base 5.

As is clearly discernible in the vertical section of FIG. 1, the frame 6 has two horizontal steps 12, 13, which serve in each case as support surfaces. Thus, a flat intermediate element 7, which is implemented here, for example, as a plate or rectangular solid body with a bottom intermediate surface 15 and a top intermediate surface 16, is loosely mounted on a lower step 12. A flat cover 8, which is implemented here, for example, as a plate or rectangular solid body with a bottom cover surface 26 and a top cover surface 27, is loosely mounted on the upper step 13.

In the process box 1, the base 5, intermediate element 7, and cover 8 are arranged over or under each other in the form of a stack. A gas-tight or quasi-gas-tight processing space 17 is enclosed by the base 5 and cover 8, together with the frame 6, with the processing space 17 divided only by the intermediate element 7 into a lower processing subspace 17a and an upper processing subspace 17b. The two processing subspaces 17a, 17b are implemented symmetrically and have roughly the same height, defined by the clearance between the plates adjacent one another. In the present exemplary embodiment, the two processing subspaces 17a, 17b are gas-tightly or quasi-gas-tightly zoned off from one another, with it being likewise conceivable for the two processing subspaces 17a, 17b to be fluidically connected to each other such that a mutual gas exchange can occur.

FIG. 1 depicts a process box 1 loaded with two substrates 3a, 3b coated on one side, with each substrate 3a, 3b implemented here, for example, as a rectangular solid with a bottom substrate surface 19a, 19b and a top substrate surface 20a, 20b. A layer structure 4a, 4b is in each case applied on the top substrate surface 20a, 20b. In the production of thin-film solar modules, the layer structure 4a, 4b is, for example, the precursor layers to be subjected to an RTP thermal treatment for producing an absorber. The lower substrate 3a rests with its bottom substrate surface 19a on the base 5 and is supported by the top base surface 10 with full-area support. Similarly, the upper substrate 3b rests with its bottom substrate surface 19b on the intermediate element 7 and is supported by the top surface of the intermediate element 16 with full-area support. With both substrates 3a, 3b, the layer structure 4a, 4b is in each case situated on the substrate side facing the cover 8.

Thus, the lower substrate 3a is situated in the lower processing subspace 17a; and the upper substrate 3b, in the upper processing subspace 17b. Since what is important for a uniform processing atmosphere, in particular during an RTP thermal treatment of the layer structure 4a, 4b, is substantially a question of the dimensioning of the clearance of the respective processing subspaces 17a, 17b, which is at least approx. equal for the two substrates 3a, 3b, the two processing subspaces 17a, 17b can be considered to be symmetrical with regard to the processing atmosphere. This supports the maintenance of particularly high quality requirements, which thin-film solar modules, for example, must satisfy as a general rule.

The various components of the process box 1 can be made from one and the same material or from materials different from each other. Typical materials are metal, glass, ceramic, glass ceramic, carbon-fiber-reinforced carbon materials, or graphite. It is essential here for the base 5 to be implemented such that a thermal treatment of the layer structure 4a of the lower substrate 3a is enabled by thermal energy supplied in the form of radiation on the underside of the base 5 or on the bottom base surface 9. Similarly, the cover 8 is implemented such that a thermal treatment of the layer structure 4b of the upper substrate 3b is enabled by thermal energy supplied in the form of radiation on the top side of the cover 8 or on the top surface 27 of the cover. The thermal energy can be supplied in a thermal treatment chamber 29 depicted schematically in FIG. 2 by radiant heaters 30 arranged, for example, in rows above the cover 8 as well as below the base 5, the design of which need not be dealt with here in detail.

For example, the base 5 and/or cover 8 include, for this purpose, a material that is transparent or at least partially transparent to the incident electromagnetic radiation, for example, glass ceramic. It is likewise also possible for the base 5 and/or cover 8 to include a material that is suitable for absorbing the electromagnetic radiation at least partially, in particular completely, in order to be heated up itself, for example, graphite. In the latter case, the base 5 and/or cover 8 serve as passively heated, secondary heat sources.

The two substrates 3a, 3b are made, for example, of glass with a thickness in the range from 1 mm to 4 mm, in particular 2 mm to 3 mm. As already mentioned, the two substrates 3a, 3b are provided in each case on their top substrate surface 20a, 20b with a layer structure 4a, 4b, which consists, for example, of thin precursor layers of an absorber (e.g., a chalcopyrite or kesterite compound), which must be subjected to an RTP thermal treatment. For example, the layer structure 4a, 4b is a sequence of the layers silicon nitride/molybdenum/copper-indium-gallium/selenium. For example, the silicon nitride layer has a thickness of the range from 50 nm to 300 nm; the molybdenum layer, a thickness in the range from 200 nm to 700 nm; the copper-indium-gallium layer, a thickness in the range from 300 nm to 1000 nm; and the selenium layer, a thickness in the range from 500 nm to 2000 nm.

The process box 1 can be assembled using automation in a simple manner outside a process chamber (e.g., thermal treatment chamber) for processing the substrates 3a, 3b and loaded with substrates coated on one side 3a, 3b. For example, for this purpose, first, the frame 6 is placed loosely on the top surface 10 of the base, and then, the lower substrate 3a is placed loosely with its bottom substrate surface 19a on the top surface 10 of the base. However, it is also conceivable for the frame 6 to be fixedly connected to the top base surface 10. The lower substrate 3a is situated inside the closed frame 6. Then, the intermediate element 7 is loosely placed on the lower step 12, which yields the closed or quasi-closed lower processing subspace 17a. Next, the second substrate 3b is loosely placed with its bottom substrate surface 19b on the top surface 16 of the intermediate element. Finally, the cover 8 is loosely placed on the upper step 13, which yields the closed or quasi-closed upper processing subspace 17b.

The process box 1 can have connector sleeves (not shown), by means of which the processing space 17 as a whole or the processing subspaces 17a, 17b can in each case be separately supplied a process gas or an inert gas.

As described in the introduction, in industrial series production of thin-film solar modules, processing of the substrates 3a, 3b occurs in an in-line system in which the loaded process box 1 is supplied to various process chambers in succession. As is known per se to the person skilled in the art, the transport of the process box 1 can be done, for example, on stub rollers, which support the process box 1 on the bottom surface of the base 9. The transport speed is typically as much as 1 m/s.

For example, the process box 1 loaded with substrates 3a, 3b is first transported into an intake airlock chamber out of which is transported into a thermal treatment chamber for RTP thermal treatment of the layer structure 4a, 4b of the two substrates 3a, 3b. In the RTP thermal treatment, the substrates 3a, 3b are, for example, heated at a heating rate of 1° C./s to 50° C./s to a temperature of, for example, 350° C. to 800° C. by radiant heaters. For example, precursor layers made of copper, indium, gallium, and selenium are converted in a sulfur-containing atmosphere into a Cu(In,Ga)(S,Se)$_2$ semiconductor layer. Then, the loaded process box 1 is transported into a cooling chamber for cooling the substrates 3a, 3b. The hot substrates 3a, 3b are, for example, cooled by as much as 50° C./s down to a temperature necessary from a process technology standpoint, for example, 10° C. to 380° C. The cooling can be done, for example, by cooling plates and accelerated by a circulating stream of gas, for example, an air, argon, or nitrogen stream. Alternatively, cooling is realizable by convection cooling or forced air cooling without cooling plates. Then, the loaded process box 1 is transported out of the cooling chamber into a discharge airlock chamber, out of which the substrates 3a, 3b can be supplied to further processing. It is understood that the structure of such an in-line system depends on the specific requirements for producing thin-film solar modules, wherein, in particular, additional heating and/or cooling chambers as well as cooling zones can be provided. Likewise, optionally, intake airlock chambers and/or discharge airlock chambers can be dispensed with.

The process box 1 enables batch-wise charging of the in-line system, wherein loaded process boxes can be processed simultaneously in different process chambers. In particular, substrates 3a, 3b can be cooled in a cooling chamber while other substrates 3a, 3b can be subjected to RTP thermal treatment in a thermal treatment chamber.

Figure 2:
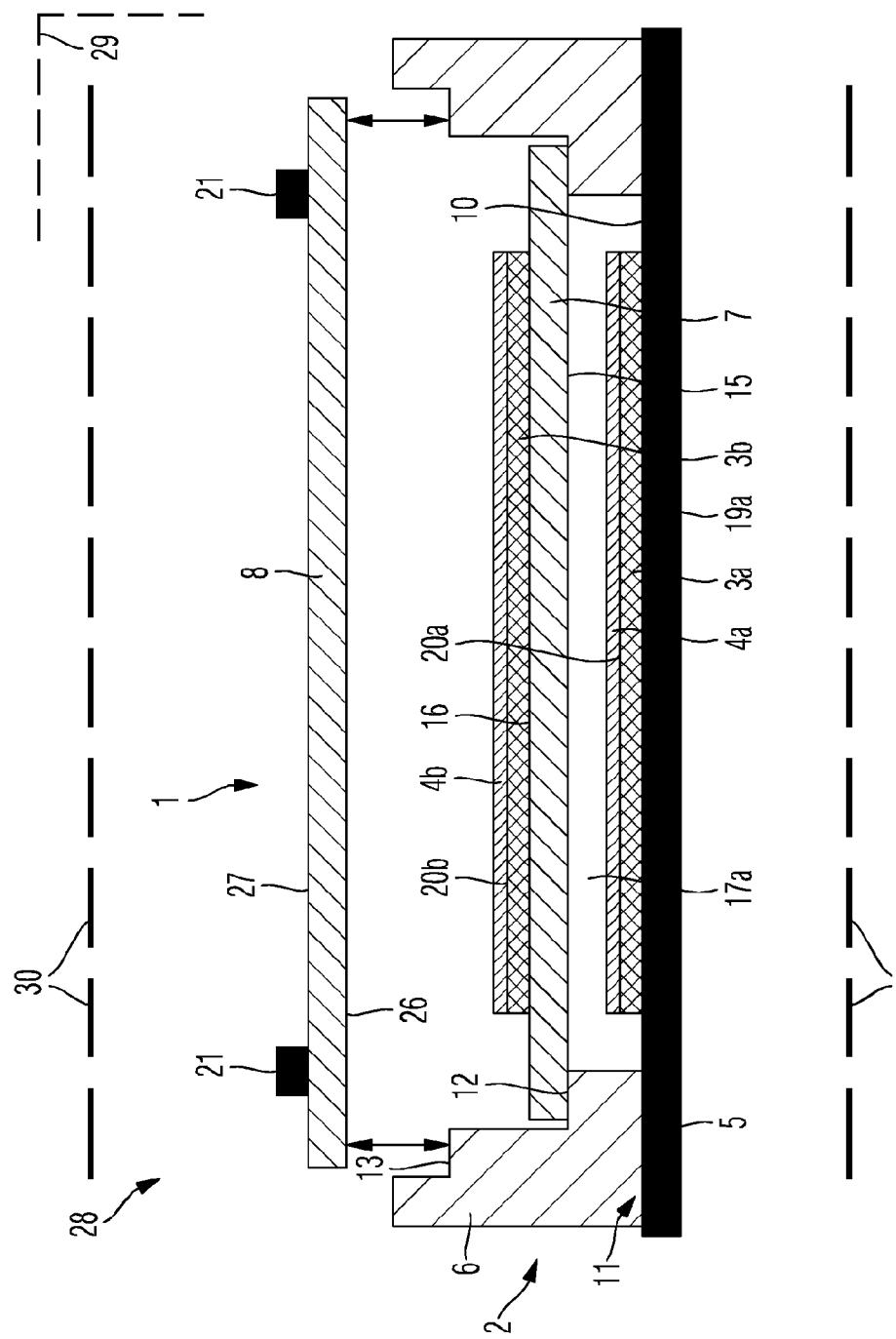
FIG. 2 a variant of the process box of FIG. 1 with a process carrier and a stationary cover.

FIG. 2 depicts a variant of the process box 1 of FIG. 1. To avoid unnecessary repetition, only the differences relative to the process box of FIG. 1 are presented; and, otherwise, reference is made to the statements concerning FIG. 1. Accordingly, the process box 1 differs in that an open process carrier 2, consisting of the base 5, frame 6, and intermediate element 7 is assembled outside the in-line system or outside a process chamber and loaded with substrates 3a, 3b. The process box 1 is not completed until it is inside a respective process chamber.

As depicted in FIG. 2, for this purpose, the cover 8 is arranged stationarily (fixed in position) in a thermal treatment chamber 29. The cover 8 can be adjusted in its vertical position by means of a movement mechanism 21 (not depicted in detail), in order to be positioned relative to the open process carrier 2, with the cover 8 loosely mounted on the upper step 13. Thus, the processing space 17 is not implemented until inside the thermal treatment chamber 29. This variant has the advantage that the same cover 8 is always usable for multiple loaded process carriers 2 in succession such that a separate cover 8 need not be provided for each process box 1. Thus, costs can be saved in series production. This variant also has the advantage that one and the same cover 8 need not be constantly heated and cooled; and, thus, energy costs can be saved. The open process carrier 2 forms, together with the stationary cover 8 and the movement mechanism 21, an arrangement for processing the substrates 3a, 3b, which is identified as a whole in FIG. 2 with the reference number 28.

Figure 3:
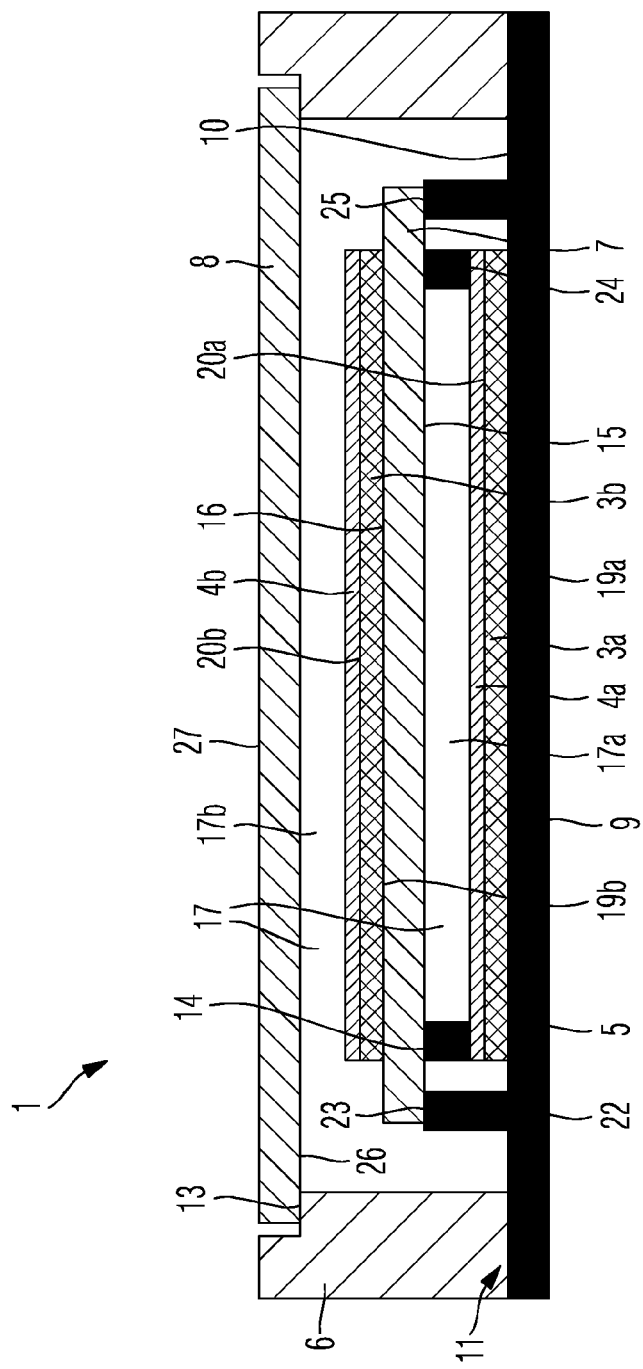
FIG. 3 another variant of the process box of FIG. 1.

FIG. 3 depicts another variant of the process box 1 of FIG. 1, where, again, only the differences relative to the process box 1 of FIG. 1 are explained; and, otherwise, reference is made to the statements there.

According to the figure, the frame 6 includes no lower step 12 for mounting the intermediate element 7, but, instead, only an upper step 13 for mounting the cover 8. Instead of the lower step 12, spacers 22, 24 are provided, which are in each case implemented in the form of a closed frame. Thus, the surface of a first spacer 22, which is loosely mounted on the top surface 10 of the base, serves as a first supporting surface 23 for the intermediate element 7. On the other hand, the top side of a second spacer 24 positioned farther inward, which, in contrast to the first spacer 22, is loosely mounted on the top side of the lower substrate 3a, serves as a second supporting surface 25 for the intermediate element 7. Since coated substrates 3a, 3b for producing thin-film solar modules have, as a rule, an edge zone 14 that is coating free or at least is not provided as an optically active area, it is advantageous for the second spacer 24 to be supported in the region of this coating free edge zone 14 on the lower substrate 3a such that no reduction in performance is caused by the second spacer 24.

The assembly and the loading of the process box 1 takes place, for example, in that, first, the frame 6 is loosely mounted on the top surface 10 of the base. Next, inside the frame 6, the first substrate 3a is loosely mounted with its bottom substrate surface 19a on the top surface 10 of the base. Then, the two frame-type spacers 22, 24 are brought into position, with the first spacer 22 loosely mounted on the top surface 10 of the base and the second spacer 24 loosely mounted on the lower substrate 3a. After that, the intermediate element 7 is loosely placed on the two support surfaces 23, 25, by which means the lower processing subspace 17a is completed. Then, the second substrate 3b is loosely mounted on the top surface 16 of the intermediate element with its bottom substrate surface 19b. Finally, the cover 8 is loosely placed on the upper step 13, by which means the upper processing subspace 17b is completed. The process box 1 can thus be assembled and loaded, using automation, simply, reliably, and economically.

It would likewise be possible, by analogy with FIG. 2, for only an open process carrier 2, consisting of the base 5, frame 6, and intermediate element 7 or consisting of the base base 5 and intermediate element 7, to be assembled and loaded in the above-described manner outside the in-line system or a process chamber. In this case, a cover 8 arranged stationarily in a process chamber is added to the process carrier 2 to produce the process box 1. Alternatively, it would also be possible for a cover 8 arranged stationarily in a process chamber as well as the frame 6 to be positioned on the process carrier 2. For this purpose, the cover 8 is advantageously fixedly connected to the frame 6. Thus, a separate cover 8 as well as, optionally, a separate frame, does not have to be provided for each process box 1.

The process box 1 according to the invention enables processing substrates coated on one side 3a, 3b, wherein the process box 1 or an open process carrier 2 can be assembled, using automation, outside a process chamber and loaded with the substrates 3a, 3b. By means of the full-area support of the two substrates 3a, 3b, substrate deformation caused by gravity can be avoided in a particularly advantageous manner. In particular, with an RTP thermal treatment, which typically occurs above the glass softening point, deformation of glass substrates 3a, 3b can thus be reliably and certainly avoided. Moreover, the layer structure 4a, 4b of the two substrates 3a, 3b does not have to be touched either before, during, or after the processing such that mechanical damage can be avoided. In particular, the position of the two substrates 3a, 3b does not have to be altered for processing, for example, by rotation of the substrates 3a, 3b, such that automated processing is greatly simplified. The processing space 17 of the process box 1 can, in a particularly advantageous manner, be divided at least approx. symmetrically into the two processing subspaces 17a, 17b such that the two substrates 3a, 3b can be processed with one and the same processing atmosphere. In addition, the supplying of heat on the top side and the underside of the process box 1 is controlled such that the most homogeneous distribution possible is present within the two substrates 3a, 3b. This is desirable with regard to a controlled conversion of the precursor materials to form the absorber in an RTP thermal treatment. The process box 1 thus supports the production of coated substrates for thin-film solar modules with high quality requirements.

Further characteristics of the invention emerge from the following description:

A transportable process box for processing substrates coated on one side, comprising: a base for the preferably full-area supported placement of a first substrate, wherein the base is implemented such that coatings of the substrates are thermally treatable by radiation supplied on the underside of the base, a frame for connecting the base with a cover, an intermediate element for the preferably full-area supported placement of a second substrate, a cover, which is mounted on the frame and is implemented such that coatings of the substrates are thermally treatable by radiation supplied on the top side of the cover.

In one embodiment of the process box, the processing space is divided (only) by the intermediate element into a first processing subspace for processing the first substrate and a second processing subspace for processing the second substrate. In another embodiment of the process box, the intermediate element is mounted on the frame. In another embodiment of the process box, the intermediate element is mounted on a first spacer supported on the base and/or on a second spacer supported on the first substrate. In another embodiment of the process box, the second spacer is supported in a coating-free edge zone of the first substrate. In another embodiment of the process box, the frame is mounted on the base. The embodiments of the process box are arbitrarily combinable with each other.

A transportable process carrier for a process box for processing substrates coated on one side, comprising a base for the preferably full-area supported placement of a first substrate, wherein the base is implemented such that coatings of the substrates are thermally treatable by radiation supplied on the underside of the base, a frame for connecting the base to a cover, wherein the frame is implemented such that the cover is mountable, an intermediate element for the preferably full-area supported placement of a second substrate, wherein the intermediate element is mounted on the frame.

An arrangement for processing substrates coated on one side in a process box, comprising: a transportable process carrier as described above, a cover stationarily arranged in a process chamber for mounting the process carrier on the frame to form the process box, wherein the cover is implemented such that coatings of the substrates are thermally treatable by radiation supplied on the top side of the cover, a movement mechanism for moving the cover and/or process carrier, wherein the movement mechanism is implemented such that the cover is mountable on the frame.

A transportable process carrier for a process box for processing substrates coated on one side, comprising: a base for the preferably full-area supported placement of a first substrate, wherein the base is implemented such that coatings of the substrates are thermally treatable by radiation supplied on the underside of the base, an intermediate element for the preferably full-area supported placement of a second substrate, wherein the intermediate element is mounted on a first spacer supported on the base and/or on a second spacer supported on the first substrate.

An arrangement for processing substrates coated on one side in a process box, comprising: a transportable process carrier as described immediately above, a cover stationarily arranged in a process chamber, with a frame fastened to the cover for connecting the base and cover to form the process box, wherein the cover is implemented such that coatings of the substrates are thermally treatable by radiation energy supplied on the top side of the cover, a movement mechanism for moving the cover with the frame and/or the process carrier, which is implemented such that the frame is mountable on the base.

A method for processing substrates coated on one side in a transportable process box, with the following steps: a) Installing and loading the process box by preparing a base, by means of which a first substrate can be supported preferably over its full area and which is implemented such that coatings of substrates are thermally treatable by radiation supplied on the underside of the base; mounting a frame on the base for connecting the base to a cover; optionally, mounting the first substrate on the base; arranging an intermediate element, by means of which a second substrate can be supported preferably over its full area; optionally, placing the second substrate on the intermediate element; mounting the cover on the frame to form the process box, wherein the cover is implemented such that coatings of the substrates are thermally treatable by radiation supplied on the top side of the cover, b) Transporting the process box into a thermal treatment chamber with radiant heaters, c) Supplying radiation on the underside of the base and/or supplying radiation on the top side of the cover for the thermal treatment of the coatings of the substrates. In one embodiment of the method, the intermediate element is mounted on the frame. In another embodiment of the method, the intermediate element is mounted on the first spacer supported on the base and/or on a second spacer supported on the first substrate. The embodiments of the method are arbitrarily combinable with each other.

A method for processing substrates coated on one side in a process box, with the following steps: a) Installing and loading a transportable process carrier, by preparing a base, by means of which a first substrate can be supported preferably over its full area and which is implemented such that coatings of the substrates are thermally treatable by radiation supplied on the underside of the base; mounting a frame on the base to connect the base to a cover; optionally, placing the first substrate on the base; installing an intermediate element, by means of which a second substrate can be supported preferably over its full area on the frame; optionally, placing the second substrate on the intermediate element; b) Transporting the process carrier into a thermal treatment chamber with radiant heaters, c) Mounting a cover stationarily arranged in the thermal treatment chamber on the frame to form the process box, wherein the cover is implemented such that coatings of the substrates are thermally treatable by radiation supplied on the top side of the cover, d) Supplying radiation on the underside of the base and/or supplying radiation on the top side of the cover for the thermal treatment of the coatings of the substrates.

A method for processing substrates coated on one side in a process box, with the following steps: a) Installing and loading a transportable process carrier, by preparing a base, by means of which a first substrate can be supported preferably over its full area and which is implemented such that coatings of the substrates are thermally treatable by radiation supplied on the underside of the base; optionally, placing the first substrate on the base; mounting an intermediate element, by means of which a second substrate can be supported preferably over its full area, on a first spacer supported on the base and/or on a second spacer supported on the first substrate; optionally, placing the second substrate on the intermediate element, b) Transporting the loaded process carrier into a thermal treatment chamber with radiant heaters, c) Mounting a frame stationarily arranged in the thermal treatment chamber and fixedly connected to a cover on the base to form the process box, wherein the cover is implemented such that coatings of the substrates are thermally treatable by radiation supplied on the top side of the cover, d) Supplying radiation on the underside of the base and/or supplying radiation on the top side of the cover for the thermal treatment of the coatings of the substrates.

LIST OF REFERENCE CHARACTERS 1 process box
2 process carrier
3a, 3b substrate
4a, 4b layer structure
5 base
6 frame
7 intermediate element
8 cover
9 bottom surface of the base
10 top surface of the base
11 edge region
12 lower step
13 upper step
14 edge zone
15 bottom surface of the intermediate element
16 top surface of the intermediate element
17 processing space
17a, 17b processing subspace
19a, 19b bottom substrate surface
20a, 20b top substrate surface
21 movement mechanism
22 first spacer
23 first supporting surface
24 second spacer
25 second supporting surface
26 bottom cover surface
27 top cover surface
28 arrangement
29 thermal treatment chamber
30 radiant heater

The invention claimed is:

1. A transportable process box for processing substrates coated on one side, comprising:
   a base, configured such that a first substrate is placeable with an uncoated substrate side with full-area support and coatings of the substrates are thermally treatable by radiation supplied on an underside of the base;
   a frame for connecting the base to a cover;
   an intermediate element, configured such that a second substrate is placeable with an uncoated substrate side with full-area contact between the second substrate and the intermediate element; and
   a cover, which is mounted on the frame and is configured such that coatings of the substrates are thermally treatable by radiation supplied on a top side of the cover, wherein a processing space for processing the substrates is formed by the base, cover, and frame.

2. The process box according to claim 1, wherein:
   the intermediate element is loosely mounted on a step formed by the frame, and
   the intermediate element divides the processing space into a first processing subspace for processing the first substrate and a second processing subspace for processing the second substrate.

3. The process box according to claim 1, wherein:
   the intermediate element is loosely mounted on a first spacer supported on the base and/or on a second spacer supported on the first substrate, and
   the intermediate element is configured such that the intermediate element, together with the first spacer or second spacer, divides the processing space into a first processing subspace for processing the first substrate and a second processing subspace for processing the second substrate.

4. The process box according to claim 3, wherein the second spacer is supported in a coating-free edge zone of the first substrate.

5. The process box according to claim 1, wherein the frame is loosely mounted on the base.

6. A method for processing substrates coated on one side in the transportable process box according to claim 1, comprising:
   installing and loading the process box, including
      preparing the base, by means of which the first substrate can be supported on the uncoated substrate side over a full area of the first substrate and which is configured such that coatings of substrates are thermally treatable by radiation supplied on an underside of the base, loose mounting of the frame on the base for connecting the base to the cover, optionally, placing the first substrate on the base, arranging the intermediate element, by means of which the second substrate can be supported on the uncoated substrate side over a full area of the second substrate, optionally, placing the second substrate on the intermediate element, and mounting the cover on the frame to form the process box, wherein the cover is configured such that coatings of the substrates are thermally treatable by radiation supplied on the top side of the cover;

transporting the process box into a thermal treatment chamber with radiant heaters; and supplying radiation on the underside of the base and/or supplying radiation on the top side of the cover for the thermal treatment of the coatings of the substrates.

7. The method according to claim 6, wherein the intermediate element, in a first alternative, is loosely mounted on a step formed by the frame or, in a second alternative, is loosely mounted on a first spacer supported on the base and/or on a second spacer supported on the first substrate.

8. An arrangement for processing substrates coated on one side in a process box, comprising:

a transportable process carrier, including a base, which is configured such that a first substrate is placeable with an uncoated substrate side with full-area support and coatings of the substrates are thermally treatable by radiation supplied on the underside of the base, a frame, which is configured such that the frame connects the base to a cover, the cover, being loosely mountable on the frame, and an intermediate element, which is configured such that a second substrate is placeable with an uncoated substrate side with full-area contact between the second substrate and the intermediate element, wherein the intermediate element is loosely mounted on a step of the frame, wherein a cover is arranged stationarily in a process chamber for loose mounting on the frame to form the process box, and wherein the cover is configured such that coatings of the substrates are thermally treatable by radiation supplied on the top side of the cover; and a movement mechanism for moving the cover and/or the transportable process carrier, wherein the movement mechanism is configured such that the cover is mountable on the frame.

9. A method for processing substrates coated on one side in the arrangement according to claim 8, comprising:

installing and loading a transportable process carrier, including in a first alternative, preparing the base, by means of which the first substrate can be supported on the uncoated substrate side over a full area of the first substrate and which is configured such that coatings of the substrates are thermally treatable by radiation supplied on the underside of the base, and loose mounting of a frame on the base for connecting the base to a cover or, in a second alternative, preparing the base, by means of which the first substrate can be supported over the full area of the first substrate and which is configured such that coatings of the substrates are thermally treatable by radiation supplied on the underside of the base, wherein the base is fixedly connected to the frame, which serves for connecting the base to the cover, optionally, placing the first substrate on the base, loose mounting of the intermediate element, by means of which the second substrate can be supported on the uncoated substrate side over a full area of the second substrate, in the first alternative, on a step formed by the frame, or, in the second alternative, on a first spacer supported on the base and/or on a second spacer supported on the first substrate, and optionally, placing the second substrate on the intermediate element;

transporting the process carrier into a thermal treatment chamber with radiant heaters;

loose mounting of a cover arranged stationarily in the thermal treatment chamber on the frame to form the process box, wherein the cover is configured such that coatings of the substrates are thermally treatable by radiation supplied on the top side of the cover; and supplying radiation on the underside of the base and/or supplying radiation on the top side of the cover for the thermal treatment of the coatings of the substrates.

10. An arrangement for processing substrates coated on one side in a process box, comprising:

a transportable process carrier, including a base, which is configured such that a first substrate is placeable with an uncoated substrate side with full-area support and coatings of the substrates are thermally treatable by radiation supplied on an underside of the base, an intermediate element, which is configured such that a second substrate is placeable with an uncoated substrate side with full-area contact between the second substrate and the intermediate element, wherein the intermediate element is loosely mounted on a first spacer supported on the base and/or is loosely mounted on a second spacer supported on the first substrate, a cover arranged stationarily in a process chamber with a frame fastened thereon for connecting the base and the cover to form the process box, wherein the cover is configured such that coatings of the substrates are thermally treatable by radiation energy supplied on the top side of the cover; and a movement mechanism for moving the cover with the frame and/or the transportable process carrier, which is configured such that the frame is loosely mountable on the base.

11. A method for processing substrates coated on one side in the arrangement according to claim 10, comprising:

installing and loading a transportable process carrier, including preparing the base, by means of which the first substrate can be supported on the uncoated substrate side over a full area of the first substrate and which is configured such that coatings of the substrates are thermally treatable by radiation supplied on the underside of the base, optionally, placing the first substrate on the base, mounting an intermediate element, by means of which a second substrate can be supported on the uncoated substrate side over its full area, on the first spacer supported on the base and/or on the second spacer supported on the first substrate, and optionally, placing the second substrate on the intermediate element;

transporting the loaded process carrier into a thermal treatment chamber with radiant heaters;

loose mounting of a frame fixedly connected to the cover and stationarily arranged in the thermal treatment chamber, wherein the cover is configured such that coatings of the substrates are thermally treatable by radiation supplied on the top side of the cover; and supplying radiation on the underside of the base and/or supplying radiation on the top side of the cover for the thermal treatment of the coatings of the substrates.

* * * * *